United States Patent
Sakaguchi et al.

(10) Patent No.: US 6,350,703 B1
(45) Date of Patent: *Feb. 26, 2002

(54) SEMICONDUCTOR SUBSTRATE AND PRODUCTION METHOD THEREOF

(75) Inventors: Kiyofumi Sakaguchi, Yokohama; Nobuhiko Sato, Sagamihara, both of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/347,260

(22) Filed: Jul. 6, 1999

(30) Foreign Application Priority Data

| Jul. 8, 1998 | (JP) | 10-192897 |
| Jun. 29, 1999 | (JP) | 11-183326 |

(51) Int. Cl.$^7$ .............................................. H01L 21/31
(52) U.S. Cl. ...................................... 438/766; 438/480
(58) Field of Search ................................ 438/480, 766, 438/795, 799, 510, 511, 519, 787, 788, 790; 257/405

(56) References Cited

U.S. PATENT DOCUMENTS

| 5,436,176 A | | 7/1995 | Shimizu et al. ................ 437/27 |
| 5,458,755 A | | 10/1995 | Fujiyama et al. ....... 204/224 R |
| 5,658,809 A | * | 8/1997 | Nakashima et al. ......... 438/766 |
| 5,885,905 A | * | 3/1999 | Nadahara et al. ............ 438/795 |
| 5,936,291 A | * | 8/1999 | Makita et al. ............... 257/405 |
| 6,180,497 B1 | | 1/2001 | Sato et al. ................... 438/458 |

FOREIGN PATENT DOCUMENTS

| JP | 57-17497 | 1/1982 |
| JP | 59-137393 | 8/1984 |
| JP | 1-259539 | 10/1989 |
| JP | 6-104199 | 4/1994 |
| JP | 8-104590 | 4/1996 |

OTHER PUBLICATIONS

H. Yamamoto et al., "Next generation semiconductor devices and silicon wafers", Mitsubishi Electric Corporation ULSI Laboratory (4–1 Mizuhara, Itami 664), pp. 662–672.

J. Liu et al., "Formation of buried oxide in silicon using separation by plasma implantation of oxygen", Applied Physics Letters, vol. 67, No. 16, Oct. 16, 1995, pp. 2361–2363.

T. Abe, "Reduction of Flow Pattern Defect Density in the Wafer Bonding Process", The Electrochemical Society, Inc., Extended Abst. Electrochem. Soc. Spring Meeting, vol. 95–1, p.596 (1998).

K. Izumi et al., "C.M.O.S. Devices Fabricated on Buried SiO$_2$ Layers Formed By Oxygen Implantation into silicon", Musashino Electrical Communication Laboratory Nippon Telegraph & Telephone Public Corporation, Electronics Letters, pp. 593–594, Aug. 31, 1978, vol 14 No. 18.

G. W. Cullen, "Single–Crystal Silicon on Non–Single–Crystal Insulators", Journal of Crystal Growth, vol. 63, No. 3, Oct. 11, 1983, North–Holland Publishing Company–Amsterdam.

* cited by examiner

*Primary Examiner*—Matthew Smith
*Assistant Examiner*—Calvin Lee
(74) *Attorney, Agent, or Firm*—Fitzpatrick, Cella, Harper & Scinto

(57) ABSTRACT

A method of producing an SOI substrate is disclosed which comprises a step of preparing an Si substrate prepared by the floating zone process (FZ process), a step of implanting oxygen ions from the principal surface side of the Si substrate thereinto to form an ion-implanted layer in the Si substrate, and a buried Si oxide layer forming step of forming an Si oxide layer buried below the single-crystal Si layer on the principal surface side, by a heat treatment of the Si substrate.

22 Claims, 8 Drawing Sheets

SEMICONDUCTOR SUBSTRATE AND PRODUCTION METHOD THEREOF

BACKGROUND OF THE INVENTION

1. Field of the Invention

The present invention relates to a method of producing a semiconductor substrate having a single crystal semiconductor layer on an insulating layer. More particularly, the invention concerns an SOI substrate produced by a method called SIMOX (Separation by IMplanted OXygen).

2. Related Background Art

Formation of a single crystal Si semiconductor layer on an insulator is commonly known as silicon on insulator (SOI) technology, and many studies about it have been conducted heretofore, because devices made by making use of the SOI technology have various advantages which cannot be achieved by bulk Si substrates for production of ordinary Si integrated circuits. Specifically, use of the SOI technology presents the advantages including the following.

1. It facilitates dielectric isolation and permits high integration.
2. It is superior in radiation resistance.
3. The parasitic capacitance is reduced, so as to permit increase of operation speed.
4. The well forming step can be omitted.
5. The latch up can be prevented.
6. Fully depleted field effect transistors can be produced, based on formation of thin film.

These are discussed in detail, for example, in the following literature. Special Issue: "Single-crystal silicon on non-single-crystal insulators"; edited by G. W. Cullen, Journal of Crystal Growth, volume 63, no. 3, pp. 429–590 (1983).

Further, there are many reports in these several years about use of SOI as a substrate to realize faster operation and lower power consumption of MOSFET (IEEE SOI conference 1994).

With use of the SOI structure in which the SOI layer is present through the insulating layer on the support substrate, because the insulating layer exists at the lower portion of the element, the element separation process can be simplified more than in the case of the elements being formed on a bulk Si wafer; as a result, device process steps are shortened. Namely, in addition to the higher performance, the SOI structure is expected to be lower in the total of wafer cost and process cost than the structure of MOSFET, IC on bulk Si.

Among others, the fully depleted MOSFETs are expected to realize faster operation and lower power consumption based on improvement in driving force. The threshold voltage (Vth) of MOSFET is normally determined by an impurity concentration in the channel part, and in the case of the fully depleted (FD; Fully Depleted) MOSFET using SOI, the thickness of the depletion layer is also affected by the thickness of SOI film. There were, therefore, strong desires for uniformity of the thickness of SOI film in order to produce large-scale integrated circuits at high yields.

The research about the formation of SOI substrate has been becoming active since the 1970s. Considerable research has been pursued on methods of heteroepitaxial growth of single-crystal Si on a sapphire substrate being an insulator (SOS: Silicon on Sapphire), methods of formation of the SOI structure by dielectric isolation based on oxidation of porous Si (FIPOS: Full Isolation by Porous Oxidized Silicon), bonding, and oxygen ion implantation.

This oxygen ion implantation is a method called SIMOX first reported by K. Izumi (K. Izumi, M. Doken, and H. Ariyoshi: Electron. Lett. 14, p. 593 (1978)). An Si wafer 91, as illustrated in FIG. 9A, undergoes implantation of oxygen ions in about $10^{17}$ to $10^{18}/cm^2$ (FIG. 9B). After that, it is annealed at the high temperature of about 1320° C. in an argon-oxygen atmosphere to convert an ion-implanted layer 94 to a silicon oxide layer 95 (FIG. 9C). As a consequence, Si atoms are bonded to oxygen ions thus implanted around the depth corresponding to the projected range ($R_p$) of ion implantation to form a silicon oxide layer 95, thus obtaining the SOI structure (the SOI substrate prepared by the use of SIMOX will be referred to hereinafter as "SIMOX wafer").

It is common practice to use a CZ wafer as a silicon substrate for production of the SIMOX wafer. The CZ wafer is a single-crystal silicon substrate made by the Czochralski process.

This CZ wafer includes grown-in defects such as COP (Crystal Originated Particles), FPD (Flow Pattern Defect), and so on, which are defects specific to the bulk wafer.

The size of these COP (Hidekazu Yamomoto, "requirements for large-diameter silicon wafers," the 23th ultraclean technology college, (August 1996)) and FPD (T. Abe, Extended Abst. Electrochem. Soc. Spring Meeting vol. 95-1, pp. 596, (May, 1995)) is approximately 0.1 to 0.2 μm. In the use of the CZ wafer, there could occur a defect called OSF (oxidation-induced stacking fault).

The details of COP, FPD, and OSF will be discussed hereinafter.

In the production heretofore of very large scale integrated circuits using this CZ wafer, devices were produced with sufficient margins to the size of the aforementioned grown-in defects, so that the COP etc. rarely affected the device characteristics.

However, for example, considering the example of DRAM, the design rules thereof have been changing as 0.5 μm for 16M-DRAM, 0.35 μm for 64M-DRAM, . . . , and, therefore, the influence of COP etc. is becoming more and more prominent on the device characteristics and yields.

Particularly, in the case of 1G-DRAM, it is mentioned that the design rules will be 0.1 to 0.15 μm.

Namely, the production of the SIMOX wafer with the CZ wafer would pose the problem that the aforementioned defects cause decrease of yield in the production of devices. Therefore, there were desires for a method of producing the SIMOX wafer without the defects of COP etc. originating in the CZ bulk wafer or with very fewer defects than the CZ wafer.

SUMMARY OF THE INVENTION

A first object of the present invention is to provide a method of producing a semiconductor substrate that can be an SIMOX wafer with higher quality than the conventional SIMOX wafers.

A second object of the present invention is to provide a method of producing an SIMOX wafer having an Si active layer with very few defects of COP etc. originating in the CZ bulk wafer. Another object of the invention is to provide an SOI substrate excellent in the quality of a buried oxide layer.

A method of producing a semiconductor substrate according to the present invention comprises:

a step of preparing a single-crystal silicon substrate produced by the FZ process;

a step of implanting ions into the single-crystal silicon substrate to form an ion-implanted layer; and a step of forming a buried insulating layer inside the single-crystal silicon substrate.

The present invention is characterized, particularly, by forming a protective film on the single-crystal silicon substrate produced by the FZ process and implanting the ions from the protective film side.

Another method of producing a semiconductor substrate according to the present invention comprises:

a step of preparing a single-crystal silicon substrate produced by the FZ process;

a step of implanting ions into the single-crystal silicon substrate to form an ion-implanted layer;

a step of forming a buried insulating layer inside the single-crystal silicon substrate; and a step of heat treating a surface of the single-crystal silicon substrate under a reducing atmosphere containing at least hydrogen.

Further, the present invention is characterized by cleaning the single-crystal silicon substrate, or the single-crystal silicon substrate having a protective layer, prior to the formation of the ion-implanted layer.

The present invention is also characterized by having a step of performing a heat treatment in an oxidizing atmosphere, after the formation of the buried insulating layer.

DESCRIPTION OF THE PREFERRED EMBODIMENTS

Figure 1:
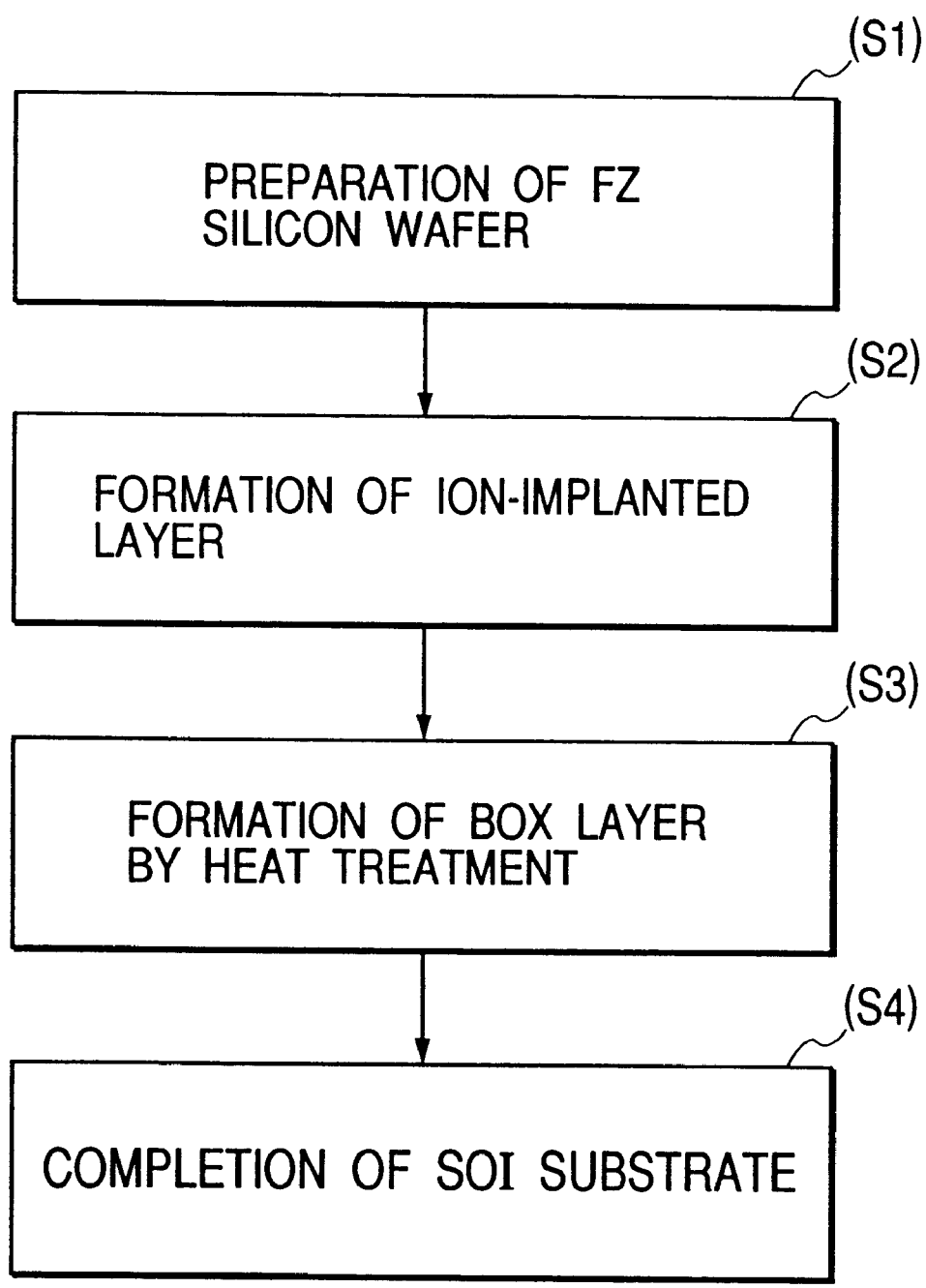
FIG. 1 is a flowchart showing an example of the method of producing the semiconductor substrate according to the present invention.

First, the present invention will be described referring to the flowchart illustrated in FIG. 1.

The first step is to prepare a single-crystal silicon substrate produced by the floating zone process (FZ process) (which will be referred to hereinafter as "FZ silicon wafer") (S1). The second step is to form an ion-implanted layer by ion implantation of oxygen ions into the single-crystal silicon substrate (S2). After that, the single-crystal silicon substrate is heat treated under desired conditions to form a buried oxide (BOX: Buried OXide) layer inside the single-crystal silicon substrate (S3). In this way, an SOI substrate is completed (S4).

Next, the present invention will be explained in more detail.

Figure 2A:
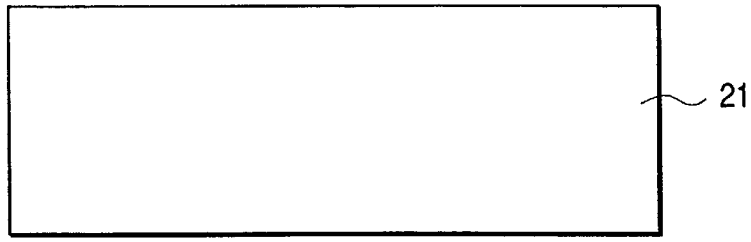
FIGS. 2A, 2B and 2C are schematic, sectional views showing an example of the method of producing the semiconductor substrate according to the present invention.

As illustrated in FIG. 2A, a single-crystal silicon substrate 21 produced by the floating zone process (FZ process) is prepared.

Figure 2B:
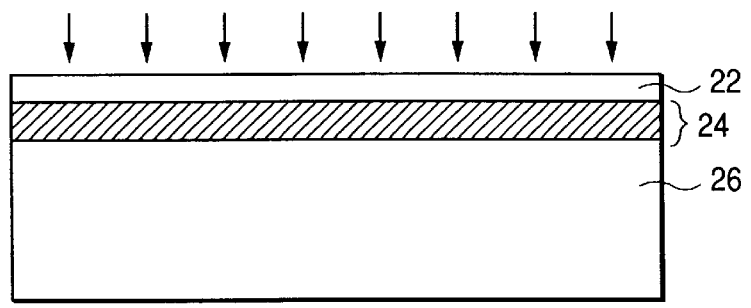

Next, as illustrated in FIG. 2B, oxygen ions are implanted by ion implantation to form an ion-implanted layer 24. Inside the single-crystal silicon substrate 21, an upper area of the ion-implanted layer 24 is denoted by 22, and a lower area by 26.

Figure 2C:
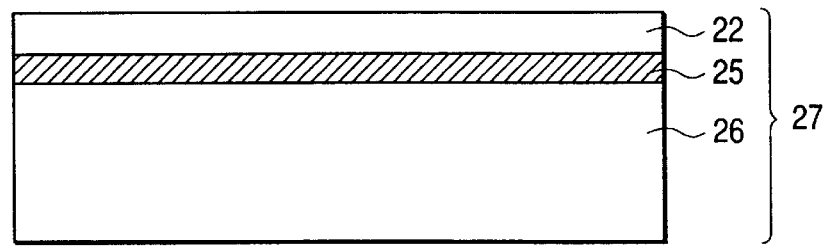

After that, a desired heat treatment is carried out to form a buried oxide (BOX) layer 25 by making use of the ion-implanted layer 24 (FIG. 2C).

This yields an SOI substrate 27 having the single-crystal silicon layer (SOI layer) 22 on the BOX layer 25.

The single-crystal silicon substrate (FZ silicon wafer) produced by the FZ process includes very fewer grown-in defects, such as COP, FPD, etc. specific to the bulk wafers, than the CZ wafers. Therefore, use of the FZ wafer permits the SIMOX wafer with high quality to be produced without the defects of COP etc. in the SOI layer 22, or with very fewer such defects than the ordinary CZ wafers. It can also prevent occurrence of OSF on or inside the silicon wafer.

Here the OSF (oxidation-induced stacking fault) is such a fault that a small defect becoming a nucleus thereof is introduced during growth of a crystal wafer and becomes manifest after oxidation. For example, there are cases where a ring pattern of OSF is observed after wet oxidation of the wafer surface.

The COP and FPD, which can be observed without a heat treatment, are considered to be defects due to the same cause and there are no precise definitions to define them. It is, however, generally known that COP is etch pits that can be detected by a fine particle detector or a contamination inspection device utilizing light scattering after the wafer is immersed in SC-1($NH_4OH/H_2O_2$) solution, which is one of element solutions for RCA cleaning, and that the latter FPD is etch pits that can be observed with an optical microscope after the wafer is immersed in Secco solution ($K_2Cr_2O_7$/HF/$H_2O$) for about 30 minutes.

(FZ silicon wafer)

Figure 8:
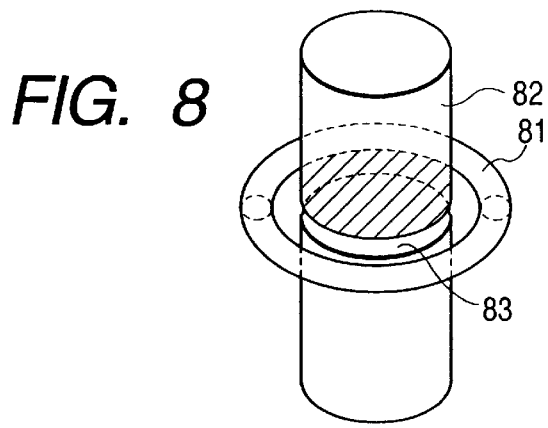
FIG. 8 is a schematic view showing an example of the production step of the FZ silicon wafer.
Figure 9A:
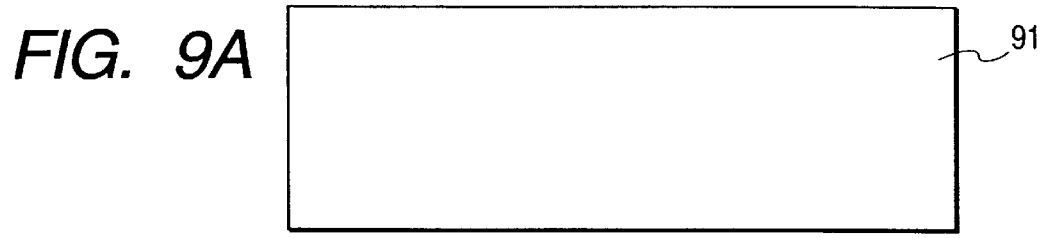
FIGS. 9A, 9B and 9C are schematic, sectional views for explaining the production steps of the conventional SIMOX wafer.
Figure 9A:
Figure 9B:
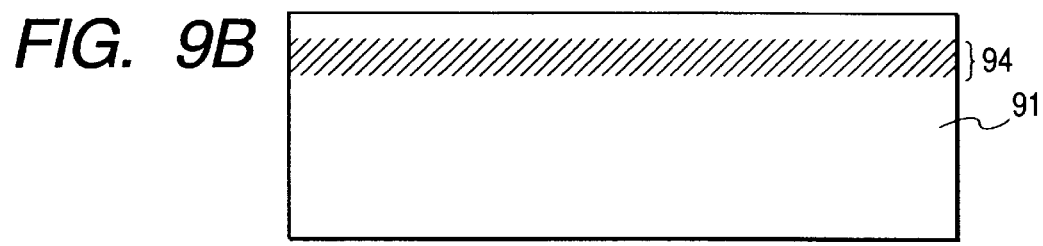
Figure 9C:
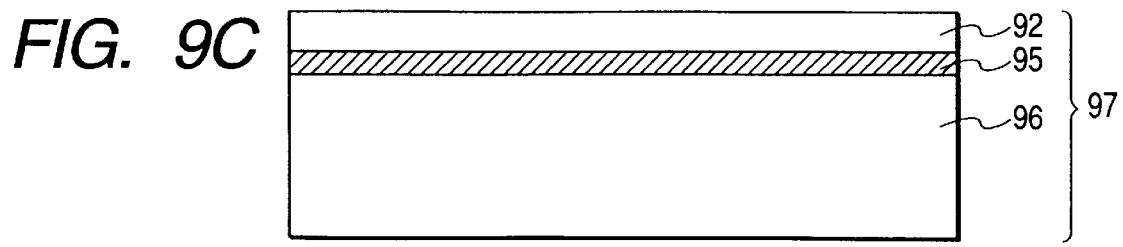

The FZ silicon wafer is a single-crystal silicon wafer obtained by carrying out a step of heating and melting a silicon stock bar 82 by induction heating coil 81, as illustrated in FIG. 8, and moving a molten zone 83 from bottom to top of the bar 82 (which will be referred to hereinafter as "FZ step"). Of course, there are cases where the movement between bottom and top is carried out two or more times.

The CZ silicon wafers contain oxygen of about $4 \times 10^{17}$ to $2 \times 10^{18}$ atoms/$cm^3$ due to fusion of a quartz crucible in the production process of the wafers. In contrast with it, the FZ silicon wafers are wafers containing a very low concentration of oxygen, approximately $1 \times 10^{16}$ atoms/$cm^3$ or less, though depending upon conditions. For that reason, the FZ silicon wafers have few crystalline defects even with a heat treatment. On the other hand, the FZ silicon wafers are easy to warp or twist with a heat treatment, because the oxygen concentration thereof is extremely low. For solving it, for example as described in Japanese Patent Publication No. 3-41437, it is preferable to raise the mechanical strength of the silicon wafer by mixing a small amount (the volume percentage of 0.05 to 5%) of nitrogen gas into an ambient gas (for example, argon gas). It is also preferable to uniform nitrogen concentrations in a single silicon crystal by diffusing nitrogen into the silicon polycrystal bar in the nitrogen atmosphere, as described in Japanese Patent Application Laid-Open No. 59-137393.

As described in Japanese Patent Application Laid-Open No. 8-104590, it is also preferable to carry out the FZ step in such a way that a ring-shaped member is provided on the upper surface side and/or on the lower surface side of the induction heating coil 81 and that the inside periphery of the ring-shaped member is put in the molten zone 83 as a melt of the silicon stock bar. The ring-shaped member receives polycrystalline grains peeled off the stock bar during the FZ step, whereby the polycrystalline grains can be prevented from redepositing onto the growing surface. This allows the single silicon crystal to be produced with high quality and high production efficiency. This ring-shaped member is preferably made of quartz, sapphire, or silicon nitride.

It is also preferable to apply a static magnetic field in the FZ step. In this case, the static magnetic field applied to the molten zone can be either a perpendicular magnetic field or a horizontal magnetic field. Particularly, it is also preferable to simultaneously apply the perpendicular magnetic field formed in a direction of the growth axis of the single-crystal silicon bar and the horizontal magnetic field formed perpendicular to the perpendicular magnetic field.

An impurity doping method in the FZ process is spraying of argon gas containing phosphine ($PH_3$), $B_2H_6$, or the like to the molten zone by use of a nozzle.

Neutron irradiation (for example, as described in Japanese Patent Application Laid-Open No. 6-104199) is preferably used for uniforming the resistivity in the wafer.

It is also preferable to use the wafer whose number of COP or FPD in the FZ silicon wafer surface is approximately 0 to 10 per unit wafer.

The conductivity type of the FZ silicon wafer can be either the p-type or the n-type. The specific resistance of the wafer can be one as desired. Particularly, the FZ silicon wafer with high resistance is suitably applicable as a substrate for production of high-frequency devices. Especially, it is preferred to suitably select the specific resistance such that the specific resistance in the vicinity of the interface between the BOX layer 25 and the lower area 26 be not less than 50 $\Omega$cm, preferably not less than 100 $\Omega$cm, and more preferably not less than 300 $\Omega$cm.

When MOS transistors etc. are formed by use of the SOI substrate, they can be subjected to perfect isolation by the BOX layer and LOCOS (LOCal Oxidation of Silicon) oxide film, so that interference of noise can be decreased between a digital part and an analog part.

Therefore, the SOI substrate obtained according to the present invention can also be suitably applied to one-chip configurations of analog circuit part, digital circuit part, and high-frequency components.

(Protective layer)

It is also preferable to form a protective layer on the substrate, prior to the implantation step of oxygen ions into the FZ silicon substrate 21. When the ions are implanted from the protective layer side, the surface of the substrate can be prevented from roughening because of the implantation step.

The protective layer can be either a silicon oxide layer or a silicon nitride layer obtained by oxidizing or nitriding the surface of the FZ silicon substrate 21.

For forming the silicon oxide layer on the substrate by thermal oxidation, applicable methods are as follows; dry oxidation, wet oxidation, steam oxidation, pyrogenic oxidation, oxygen partial pressure oxidation, oxidation with hydrochloric acid, and so on.

Of course, the protective layer may be formed by depositing a silicon oxide film or a silicon nitride film on the substrate by thermal CVD, plasma CVD, or the like, or PVD.

The thickness of the protective layer is preferably several nm to several $\mu$m approximately.

(Ion-implanted layer)

In the oxygen ion implantation step the acceleration voltage can be in the range of 1 keV to 10 MeV, and, because the thickness of the ion-implanted layer varies depending upon the acceleration voltage, it is preferably determined in the range of several 10 keV to 500 keV approximately so as to satisfy the desired conditions.

The implantation dose is in the range of $1.0\times10^{16}$/cm$^2$ to $1.0\times10^{19}$/cm$^2$ and more preferably in the range of $5.0\times10^{16}$/cm$^2$ to $5.0\times10^{18}$/cm$^2$. When it is desirable to shorten the time necessary for the implantation, the dose is preferably in the range of $5.0\times10^{16}$/cm$^2$ to $5\times10^{17}$/cm$^2$. Further, if necessary, the ITOX process may be carried out to increase the dielectric strength.

The temperature during the ion implantation is preferably in the range of $-200°$ C. to $600°$ C., more preferably in the range of $0°$ C. to $600°$ C. or below, and further preferably in the range of room temperature to $600°$ C. or below.

From the viewpoint of maintaining the crystallinity of the silicon layer and in order to obtain a good buried oxide layer with fewer current leaks, the substrate temperature during the implantation is preferably in the range of $550°$ C. to $650°$ C.

The ion implantation of oxygen ions into the silicon substrate is normally carried out as follows; oxygen ions ($O^+$) are selected out of various ions from ion sources by a mass separation device, the $O^+$ ions thus selected are accelerated by the desired acceleration voltage, and thereafter the ions are implanted into the silicon substrate with an ion beam obtained by the acceleration. On this occasion, the implantation step into the silicon substrate is carried out with scanning of the ion beam in order to implant the ions over the entire surface of the substrate. It is a matter of course that the implantation method is not limited to this method.

On the other hand, it is also preferable to carry out the ion implantation step of oxygen ions by plasma immersion doping (Plasma Immersion Ion Implantation) (Jingbao Liu et al., Appl. phys. Lett., 67, 2361 (1995)).

Since this method permits full irradiation over a large area without use of the beam form, it can shorten the time necessary for the oxygen ion implantation and can also decrease the cost. Of course, the implantation can also be carried out by low energy ion implantation, plasma gas immersion laser doping (PGILD), fast gas immersion doping, and so on.

If silicon nitride is desired instead of the silicon oxide layer as an insulating layer in the SOI substrate, nitrogen ions can also be implanted instead of the implantation of oxygen ions.

The implantation can also be carried out in a plurality of ion implantation steps with stepwise change of implantation dose and/or implantation energy (acceleration voltage). In the case of the implantation with change of implantation energy, the implantation energy of the second step is preferably set to be smaller than the implantation energy of the first step In the case of the implantation including a plurality of ion implantation steps, the ion species implanted into the silicon substrate can also be changed between the steps. In the implantation comprised of two ion implantation steps, it is preferable to first carry out ion implantation of the first ions and thereafter carry out ion implantation of the second ions lighter than the first ions. For example, the first ions are oxygen ions and the second ions hydrogen ions.

In cases where the protective layer is not formed on the upper surface of the silicon substrate prior to the step of the formation of the ion-implanted layer, it is also preferable to form the protective layer on the surface of the silicon substrate after the step of formation of the ion-implanted layer. In this case, the surface of the substrate can be prevented from roughening because of the high-temperature heat treatment during the formation of the BOX layer.
(Formation of BOX layer)

A heat treatment atmosphere during the formation of the BOX layer 25 being the buried oxide layer is an ambience mainly containing a gas selected from oxygen, nitrogen, Ar, He, Ne, and Xe and, more preferably, a gas ambience of oxygen diluted with an inert gas (for example, a gas ambience of mixture of argon and oxygen). For example, the atmosphere is a non-oxidizing atmosphere in which oxygen of 1% or less is mixed with argon gas.

The BOX layer can also be formed by a heat treatment in a reducing atmosphere containing hydrogen.

The temperature of the heat treatment during the formation of the BOX layer is not less than 600° C. nor more than the melting point of silicon, preferably not less than 800° C. nor more than the melting point of silicon, and still more preferably not less than 1000° C. nor more than 1400° C.

When the BOX layer is formed in the reducing atmosphere containing hydrogen, the treatment is carried out particularly preferably in the temperature range of not less than 800° C. nor more than 1350° C. However, in order to suppress the reduction of the area itself which becomes the BOX layer, the treatment is carried out preferably in the temperature range of not less than 800° C. nor more than 1000° C.

The time of the heat treatment during the formation of the BOX layer is not less than 0.5 hour nor more than 20 hours and preferably not less than 2 hours nor more than 10 hours. Although the heat treatment should be preferably carried out within as short time as possible, it is desirable to define the time of the heat treatment so as to form a uniform and continuous BOX layer.

The pressure during the formation of the BOX layer can be the atmospheric pressure, a low pressure, or a high pressure. With small implantation doses of oxygen ions, a leak of current could occur where the BOX layer is formed.

In order to avoid this current leak, it is also possible to increase the amount of oxygen ions implanted, but the time necessary for the implantation will also increase considerably with increase of implantation dose.

For forming the BOX layer in sufficient thickness without increase of implantation dose, it is thus preferable to employ the ITOX (Internal Thermal Oxidation) process. An example of application of this ITOX process to the present invention will be described referring to FIGS. 7A to 7E.

Figure 7A:
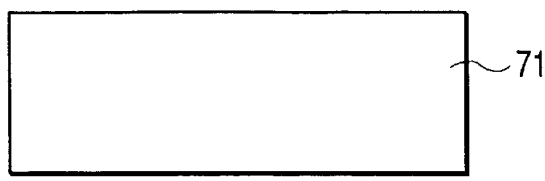
FIGS. 7A, 7B, 7C, 7D, and 7E are schematic, sectional views showing an example of the method of producing the semiconductor substrate according to the present invention.
Figure 7B:
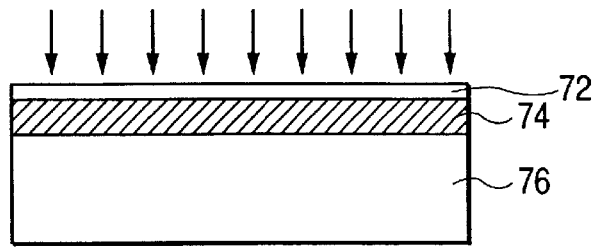

First, the FZ silicon wafer 71 is prepared as illustrated in FIG. 7A. Oxygen ions are implanted into the FZ silicon wafer to form the ion-implanted layer 74 (FIG. 7B).

After that, a cleaning step is carried out if necessary and thereafter the substrate is annealed under a non-oxidizing atmosphere. In this case, it is desirable to add 1% or less oxygen to the aforementioned non-oxidizing atmosphere in order to prevent the surface roughening due to the heat treatment. Of course, the atmosphere is not necessarily limited to the non-oxidizing atmosphere so long as a desired BOX layer is obtained.

Figure 7C:
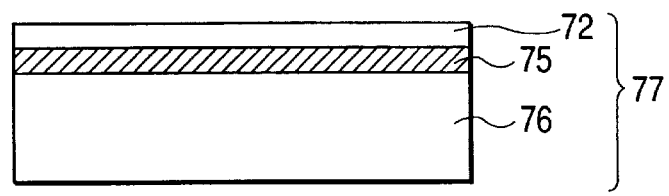
Figure 7D:
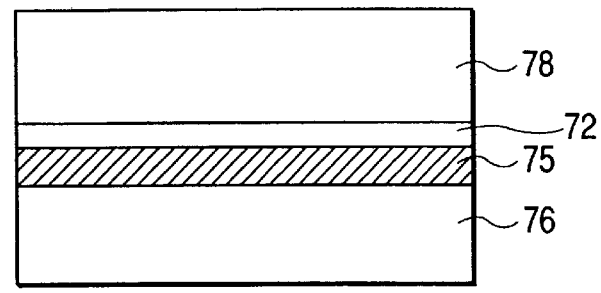

This annealing under the non-oxidizing atmosphere implements recovery from disorder of crystallinity caused by the ion implantation and forms the buried oxide layer (BOX layer) 75 (FIG. 7C). The substrate is then annealed at high temperature to bring about thermal oxidation called the ITOX process (FIG. 7D). This ITOX process permits the buried oxide silicon layer 75 to additionally grow without depending upon the oxygen ion implantation step. Numeral 78 designates an oxidized silicon film. This ITOX process is carried out under an oxidizing atmosphere (for example, $O_2/Ar$) and is preferably carried out at the temperature not less than 1200° C. and more preferably at the temperature not less than 1300° C. nor more than the melting point of silicon in terms of the recovery of crystallinity and the quality of the buried oxide layer.

Use of this ITOX step can improve the quality of the BOX layer and form the SOI layer 72 in an extremely small thickness.

Figure 7E:
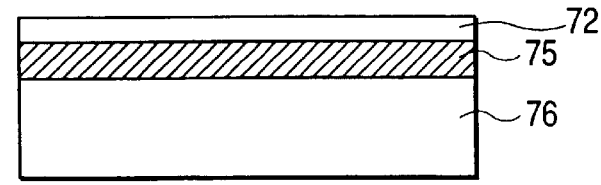

After that, the surface silicon oxide film 78 is removed as occasion may demand, thereby completing the SOI substrate (FIG. 7E).

It is noted that it is also preferable to form the protective layer prior to the ion implantation step, though not illustrated in FIG. 7A.

The SOI substrate is obtained after the formation of the BOX layer, and where the surface of the SOI layer 22 or 72 is rough, it is preferable to carry out a planarization step of the surface of the SOI layer after the removal of the surface oxide film as occasion may demand.

Specifically, the planarization is effected by chemical mechanical polishing (CMP) or hydrogen annealing. An abrasive in CMP can be selected from abrasives of borosilicate glass, titanium dioxide, titanium nitride, aluminum oxide, iron nitrate, cerium oxide, colloidal silica, silicon nitride, silicon carbide, graphite, diamond, and so on, or abrasive solutions of mixtures of the aforementioned abrasives with an oxidizer such as $H_2O_2$, $KIO_3$, or the like or with an alkali solution of NaOH, KOH, or the like.

When the planarization of the surface of the SOI layer is carried out by hydrogen annealing, an atmosphere thereof can be 100% hydrogen gas, or a mixed gas of hydrogen with a rare gas (Ar, Ne, etc.). During the hydrogen annealing, boron or phosphorus existing in the SOI layer diffuses outwardly, so as to increase the resistance of the SOI layer to high resistance.

The temperature during the hydrogen annealing is not less than 800° C. nor more than 1350° C. and more preferably not less than 850° C. nor more than 1250° C.

The pressure of the reducing atmosphere containing hydrogen during the hydrogen annealing can be an atmosphere of either the atmospheric pressure or a low pressure, but the pressure is preferably the atmospheric pressure or a pressure not less than $1 \times 10^4$ Pa nor more than the atmospheric pressure ($1 \times 10^5$ Pa). It is also more preferable to carry out the hydrogen annealing under a pressure a little, $-100$ mmH$_2$O approximately, lower than the atmospheric pressure.

A furnace used for the hydrogen annealing can be either a vertical heat treatment furnace or a horizontal heat treatment furnace used normally. A heater can be one selected from a resistance heating unit, a high-frequency heating unit, and so on.

Another annealing method is lamp heating utilizing heat radiation, used in RTA (Rapid Thermal Annealing). In this case a rapid annealing device can be one selected from an infrared annealing device using a halogen lamp, an arc lamp, or the like, a flash lamp annealing device using a xenon flash lamp or the like, and so on. Particularly, in the case of the lamp heating, the hydrogen annealing can be completed within a short time.

The time necessary for the hydrogen annealing is several seconds to several ten hours and more preferably several seconds to several hours.

In cases where the protective layer is formed on the FZ silicon wafer 21, the protective layer is removed if necessary, after the formation of the BOX layer 25. This removal of the protective layer is carried out by polishing, grinding, CMP, dry etching, or wet etching (an etchant in this case is one of hydrofluoric-nitric acid base, ethylene diamine base, KOH base, and hydrazine base etchants, or can be one selected from hydrofluoric acid, mixtures of hydrofluoric acid with at least one of hydrogen peroxide and alcohol, and mixtures of buffered hydrofluoric acid with at least one of hydrogen peroxide and alcohol).

(Embodiment 1)

FIGS. 3A to 3D are schematic, sectional views showing steps of Embodiment 1 of the present invention.

Figure 3A:
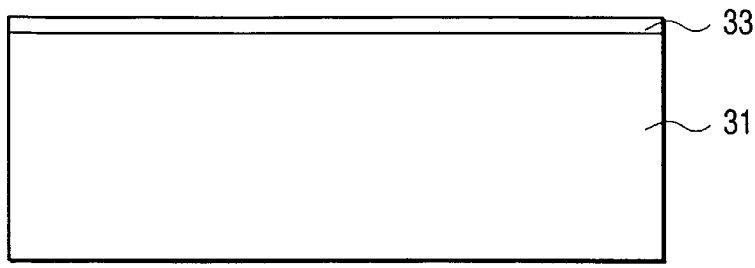
FIGS. 3A, 3B, 3C, and 3D are schematic, sectional views showing a first embodiment of the present invention.

First prepared is a substrate 31 of a single-crystal Si wafer produced by the floating zone process (FZ process), as an Si substrate. An insulating layer 33 may be further formed on the surface of the substrate if necessary (FIG. 3A).

Figure 3B:
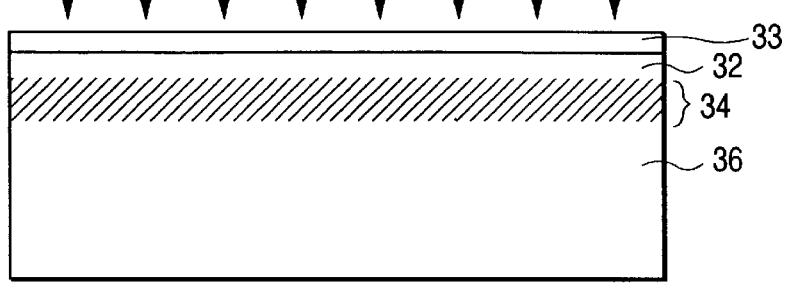

Then oxygen ions are implanted from the principal surface side of the substrate 31 thereinto. In this way, an ion-implanted layer 34 is formed to define a lower area 36 and an upper area 32 in the substrate 31 (FIG. 3B).

Figure 3C:
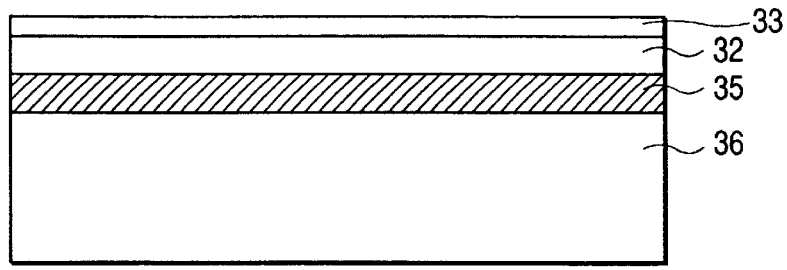

Then the substrate 31 undergoes a heat treatment to form the buried oxide layer 35, as illustrated in FIG. 3C.

In this way an SOI substrate 37 is completed with the single-crystal silicon layer 32 on the oxide layer 35.

Since the single-crystal Si layer 32 remaining on the Si oxide layer 35 is one formed by the FZ process, occurrence of FPD and COP is well suppressed therein.

Figure 3D:
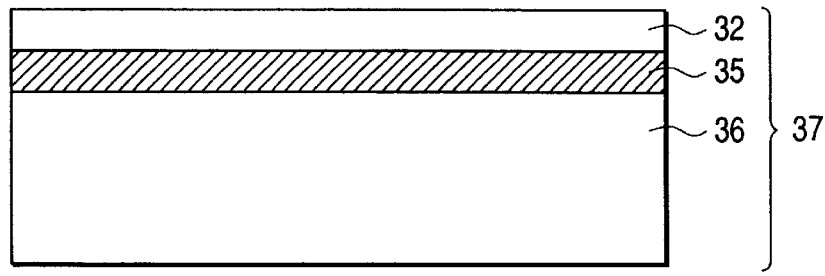

Then the surface oxide film 33 is removed to obtain a semiconductor substrate (SIMOX wafer) according to the present invention, as illustrated in FIG. 3D. Of course, the surface oxide film 33 may be left without being removed, until immediately before the device process in order to avoid contamination of the surface. The single-crystal Si layer 32 obtained in this way is formed as a flat and uniform thin layer with intervention of the Si oxide layer 35 across a large area over the entire wafer surface. The semiconductor substrate thus obtained can be suitably used from the viewpoint of the production of dielectric-isolated semiconductor devices, too.

Further, the substrate may be subjected to a heat treatment in a reducing atmosphere containing hydrogen (hydrogen annealing) after the removal of the surface oxide film 33 as occasion may demand. This heat treatment makes the roughness of the surface smoother. This smoothing method by the heat treatment permits smoothing of the surface without use of touch polishing having stronger mechanical polishing action than chemical etching action, so as to prevent fine scratches from being introduced into the surface.

When the single-crystal layer contains a relatively large amount of boron, the above hydrogen annealing causes boron to diffuse outwardly out of the substrate, so that the boron concentration can be decreased in the single-crystal layer.

Since the substrate 31 as a starting material used in the present invention is one produced by the FZ process, the SOI layer 32 can be obtained with very fewer defects of COP etc. than the SIMOX wafers produced using the CZ silicon wafers.

The implantation amount (dose) of oxygen ions used in the present invention is $1\times10^{16}$ cm$^{-2}$ to $1\times10^{19}$ cm$^{-2}$, preferably $5\times10^{16}$ cm$^{-2}$ to $5\times10^{18}$ cm$^{-2}$, and more preferably $4\times10^{17}$ cm$^{-2}$ to $5\times10^{18}$ cm$^{-2}$.

The atmosphere of the heat treatment in the formation of the Si oxide layer after the oxygen ion implantation is an atmosphere mainly containing a gas selected from oxygen, nitrogen, Ar, He, Ne, and Xe, and more preferably a gas atmosphere of oxygen diluted with an inert gas (for example, argon).

The temperature of the heat treatment in the formation of the buried Si oxide layer is not less than 1250° C. and more preferably not less than 1300° C. but less than the melting point of single-crystal Si.

The time of the heat treatment is not less than 2 hours and more preferably not less than 4 hours.

The reason is that too short time of the heat treatment will result in insufficient formation of the buried oxide layer.

It is more preferable to carry out the cleaning step, the ion implantation step, and the heat treatment step at least once more after the formation of the Si oxide layer by one cycle of ion implantation and heat treatment.

This permits formation of a uniform buried Si oxide layer with very suppressed current leak.

The reducing atmosphere during the heat treatment for smoothing used in the present invention is 100% hydrogen, or a reducing atmosphere consisting of hydrogen and an inert gas. The inert gas used herein is either of He, Ar, Ne, Xe, $N_2$, and so on.

The time of the heat treatment is not less than 10 minutes and preferably not less than 1 hour, depending upon the size of the Si substrate and the thickness of the surface layer from which the defects are removed by the heat treatment.

(Embodiment 2)

The second embodiment of the present invention will be described first referring to the flowchart of FIG. 4.

The FZ silicon wafer is prepared (S1). The protective layer is formed on the FZ silicon wafer and thereafter oxygen ions are implanted into the FZ silicon wafer from the protective layer side to form an ion-implanted layer (S2). After that, the single-crystal silicon substrate undergoes a heat treatment under the desired conditions to form the BOX layer inside the single-crystal silicon substrate (S3). The steps so far are similar to those in the flowchart of FIG. 1. It is noted that the protective layer forming step can be omitted from the step (S2) as occasion may demand.

In the present embodiment, after the formation of the BOX layer, the FZ silicon wafer is cleaned (S4). Then the ion-implanted layer forming step is carried out again (S5). After that, the heat treatment is carried out again, as in step (S3), to form the BOX layer (S6). The SIMOX wafer is completed in this way (S7). If there exists a particle on the surface of substrate on the occasion of the ion implantation it can work as a mask and form a region where the ion-implanted layer is not formed. Since the present embodiment involves the steps of forming the BOX layer once, thereafter cleaning the surface of the silicon substrate, and again implanting oxygen ions, unevenness in implantation of oxygen ions can be prevented well.

Figure 4:
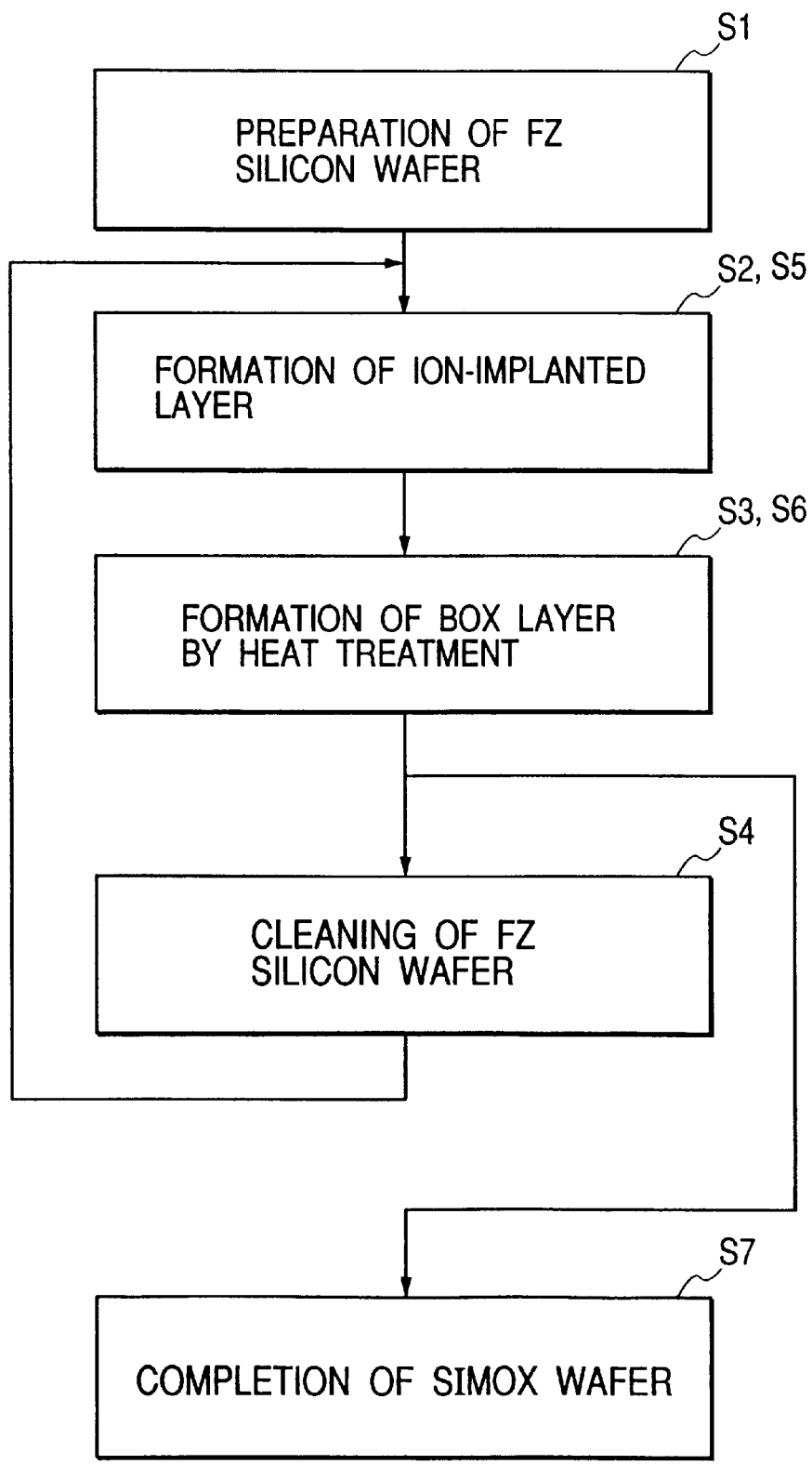
FIG. 4 is a flowchart for explaining a second embodiment of the present invention.

Although FIG. 4 shows the example of two ion implantation steps, the number of ion implantation steps can be determined arbitrarily as occasion may demand. It is also preferable to clean the silicon substrate after the step (S1) and before the step (S2).

The heat treatment (S3, S6) for formation of the BOX layer may be carried out only once after completion of the final ion implantation step.

FIGS. 5A to 5F are schematic, sectional views showing the steps in Embodiment 2 of the present invention.

Figure 5A:
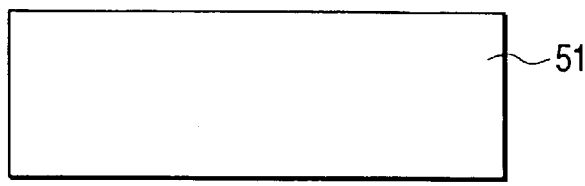
FIGS. 5A, 5B, 5C, 5D, 5E, and 5F are schematic, sectional views showing the second embodiment of the present invention.
Figure 5B:
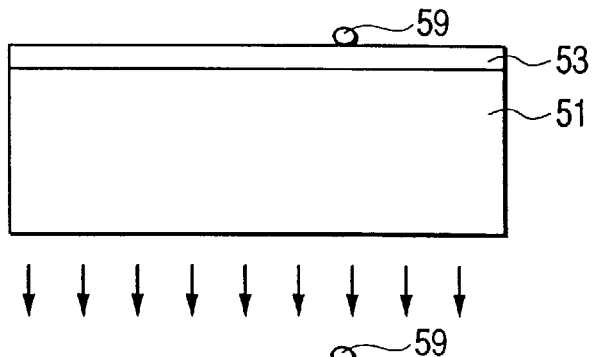

In FIG. 5A, first, the single-crystal silicon wafer 51 produced by the FZ process is prepared as an Si substrate. Further, it is better to form an Si oxide layer 53 on the surface of the substrate 51 according to the necessity in order to prevent the surface roughening during the ion implantation (FIG. 5B).

Figure 5C:
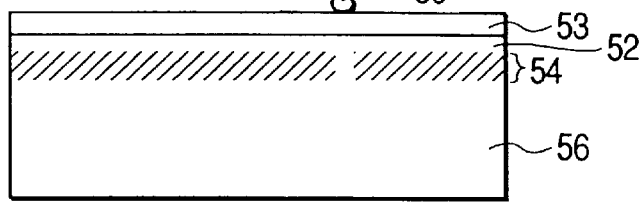

Next, oxygen ions are implanted from the principal surface of the substrate 51 (FIG. 5C). In this figure, numeral 59 represents a particle on the substrate. The ion-implanted layer 54 is formed inside the substrate 51 so as to exist between the lower area 56 and the upper area 52 of the substrate 51. Of course, where the protective layer 53 is formed, it is desirable to implant the ions from the side of the protective layer 53.

Figure 5D:
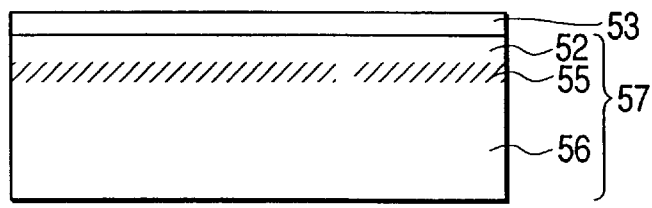
Figure 5E:
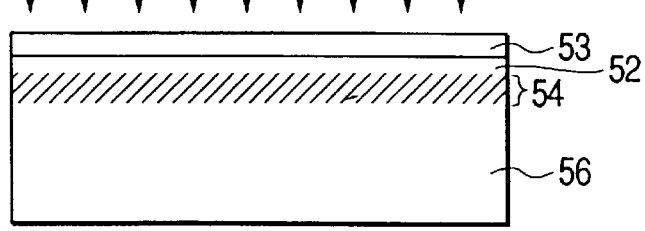
Figure 5F:
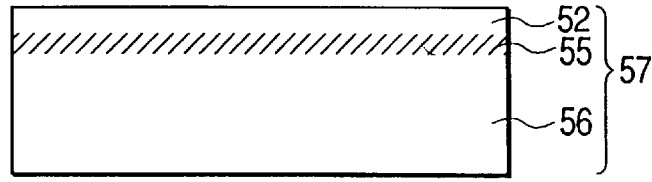

Next, as illustrated in FIG. 5D, the substrate 57 is heat treated to change the ion-implanted layer 54 into oxidized Si, thereby forming the buried Si oxide layer (BOX layer) 55.

(Multi-step implantation: Multi-I/I)

After that, the substrate 57 is cleaned and the ion implantation step (FIG. 5E) and the heat treatment step (FIG. 5F) are carried out again in similar fashion to the above steps.

If there remains a particle on the wafer surface during the previous ion implantation it can work as a mask to form a region without implanted ions (FIG. 5D). However, such nonuniformity of the BOX layer can be prevented by again carrying out the ion implantation after the cleaning step between the implantation steps.

It is also preferable to carry out the third ion implantation step and the third heat treatment step after further cleaning.

The buried oxide layer 55 can be obtained with good quality by repeatedly carrying out several cycles of the cleaning, ion implantation, and heat treatment steps in this way.

Further, a smooth surface having the surface roughness not more than several nm can be obtained by removing the surface oxide film 53 and thereafter carrying out a heat treatment in the reducing atmosphere containing hydrogen.

(Embodiment 3)

FIGS. 6A to 6E are schematic, sectional views showing the steps in Embodiment 3 of the present invention.

Figure 6A:
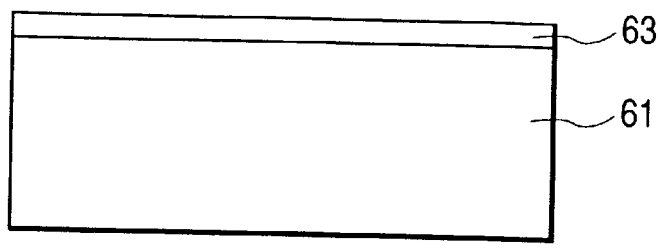
FIGS. 6A, 6B, 6C, 6D, and 6E are schematic, sectional views showing a third embodiment of the present invention.

In FIG. 6A, first, the substrate 61 of the singlecrystal Si wafer produced by the FZ process is prepared as an Si substrate. The protective layer 63 of an Si oxide film or the like may be formed on the surface of the substrate 61 according to the necessity to prevent the surface roughening during the ion implantation.

Figure 6B:
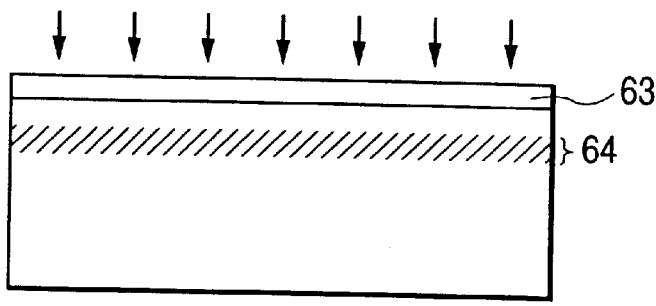

Next, the oxygen ions are implanted from the principal surface of the substrate 61, as illustrated in FIG. 6B, to form the ion-implanted layer 64. Where the protective layer 63 is formed, the ions are implanted from the side of the protective layer 63.

Figure 6C:
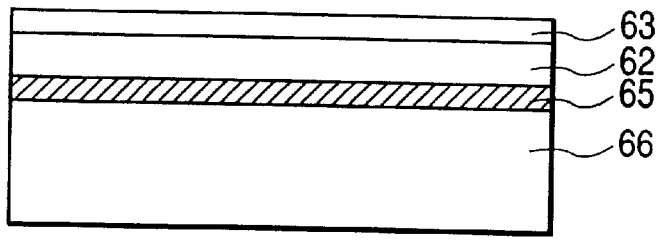

Next, as illustrated in FIG. 6C, the substrate is heat treated to form the buried Si oxide layer 65. It is a matter of course that the desired cleaning step may be carried out prior to the heat treatment. The protective layer 63 may be removed after the ion implantation as occasion may demand. (ITOX step)

Figure 6D:
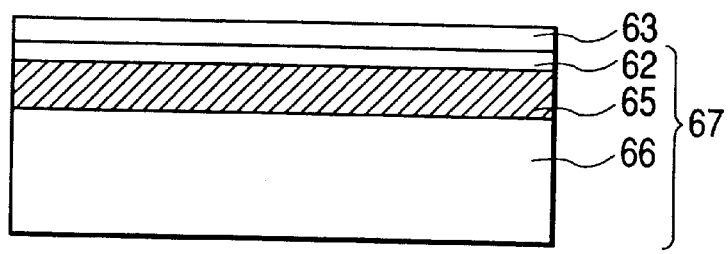

After that, the substrate 67 undergoes a heat treatment in the oxidizing atmosphere (FIG. 6D).

Figure 6E:
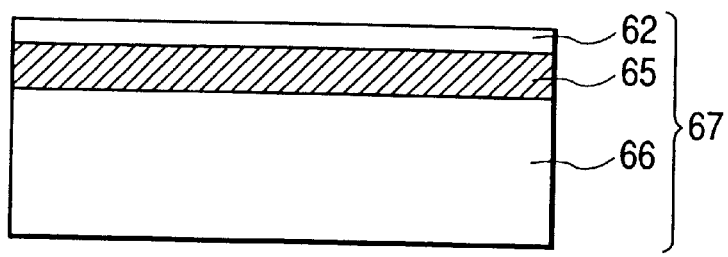

This heat treatment in the oxidizing atmosphere again forms a surface oxide layer in the surface of the single-crystal Si layer 62 and also increases the thickness of the buried oxide layer 65 inside, thereby enhancing the reliability of the buried Si oxide layer 65. Therefore, the thickness of the single-crystal Si layer becomes thinner, so as to obtain the single-crystal Si thin layer 62 (FIG. 6E).

It is desirable to make the oxidizing atmosphere of oxygen and an inert gas. For restraining forming rates of the oxide film in the surface and promoting increase in the thickness of the internal oxide layer, it is desirable to decrease the oxygen concentration in the atmosphere and increase the temperature of the heat treatment.

Then the surface oxide film 63 is removed to obtain the semiconductor substrate having the single-crystal Si thin layer 62 with few defects on the buried Si oxide layer 65. Since the SIMOX wafer thus produced is made based on the FZ substrate, the SOI layer can be obtained with very few defects of COP and the like.

Further, after the removal of the surface oxide film 63, the substrate may be subjected to the heat treatment in the reducing atmosphere containing hydrogen as described previously. This heat treatment can smooth the surface down to the surface roughness not more than several nm.

FIG. 8 is a view showing the principle of the method of producing the single-crystal Si substrate according to the FZ process.

The ring-shaped heater 81 is placed around the cylindrical crystal silicon ingot 82 having the diameter of 100 mm to 300 mm, and this heater 81 is moved vertically. Si 83 melted in the belt form by the heater 81 is retained by surface tension to be crystallized into a single crystal of a circular cylinder shape. This single-crystal Si ingot is sliced in a disk shape and polished to obtain FZ Si wafers. The coil of the heater is, for example, a melting coil to which high-frequency power of 1 to 3 MHz is supplied from a high-frequency oscillator.

When the single-crystal silicon is produced by the FZ process as described above, it is formed without contact with other materials such as the quartz crucible in the CZ process, and the substrate itself is thus unlikely to be contaminated by oxygen, boron, aluminum, and so on. Since the CZ waqfer has COP inside of the wafer, there is a case where oxygen implantred

EXAMPLE 1

As silicon substrates, there were prepared an 8-inch single-crystal silicon substrate (the FZ silicon wafer, p-Si (100)) produced by the FZ process and a CZ silicon wafer for comparison.

The ion implantation of oxygen ions was carried out up to $1.5 \times 10^{18}$ cm$^{-2}$ by the acceleration energy of 180 keV. The temperature of the substrate during the implantation was 550° C.

After that, each of the substrates was heat treated at 1350° C. in an O$_2$ (10%)/Ar (90%) atmosphere for four hours.

The SIMOX wafers (SOI wafers) were obtained each in the structure of single-crystal Si semiconductor layer (SOI layer) 179 nm/buried Si oxide layer (BOX layer) 400 nm.

After that, for detecting COP in the surface of the SOI layer, the SOI wafers were treated with the SC-1 cleaning solution (a mixture of NH$_4$OH 1.0 wt %, H$_2$O$_2$ 6.0 wt %, and water) for ten minutes. Then the number of COP (approximately 0.1 to 0.2 μm) in the surface of the SOI wafers was counted using a surface particle inspector (SP-1 available from KLA-Tencor Inc.).

The number of COP per unit wafer was 200 in the surface of the SOI layer formed based on the CZ silicon wafers. The "per unit wafer" in the present example means "per area of wafer"; for example, in the case of an 8-inch wafer, the number of COP per unit wafer is equivalent to the number of COP per about 324 cm$^2$.

On the other hand, no COP was counted per unit wafer in the case of the SOI substrate being produced using the FZ silicon wafer. In this way, the SOI wafer was obtained substantially without COP which was the defects originating in the CZ-Si substrate.

If the surface of the Si substrate is oxidized before the oxygen ion implantation step to form the protective layer, the surface roughening due to the ion implantation can be prevented effectively.

If the substrate is further subjected to hydrogen annealing after the formation of the BOX layer, still more decrease can be achieved in the defects of COP and the like.

It is also preferable to thermally oxidize the surface of the silicon substrate to form a silicon oxide layer as a protective layer, prior to the formation of the ion-implanted layer. When the surface of the ordinary CZ wafers is thermally oxidized to form a silicon oxide layer, OSF (oxidation-induced stacking fault) can appear in the wafers. If the fault exists in an area to become the SOI layer, it will affect the quality of the SOI layer. However, since the surface of the FZ silicon wafer is oxidized in the present invention, introduction of OSF can be prevented. A conceivable reason is that the oxygen concentration in the surface of substrate is lower in the FZ wafer than in the CZ wafer.

Since the CZ wafer contains COP inside of the wafer too, there is a case where the oxygen implanted by the heat treatment during formation of the BOX layer is concentrated also at the periphery of the COP. This may result in formation of larger COP (defect). The presence of the larger COP in the SOI layer may degrade the device characteristics.

On the other hand, since the FZ wafer contains little COP inside of the wafer, there is no possibility that COP may be increased by implanted oxygen, so that SOI substrates of high quality can be provided.

EXAMPLE 2

Single-crystal Si substrates produced by the FZ process were prepared as Si substrates.

Further, the surface of these Si substrates was thermally oxidized to form a surface Si oxide film in the thickness of 50 nm. This oxide film was formed for the purpose of preventing the surface roughening during the ion implantation.

The ion implantation of $O^+$ was carried out up to $2\times10^{18}$ cm$^{-2}$ by 180 keV through the Si oxide film of the surface. The temperature during the implantation was 550° C. This formed the ion-implanted layer having a concentration peak near 400 nm from the surface of the substrate.

After this, the substrates were heat treated at 1350° C. in the $O_2$ (10%)/Ar (90%) atmosphere for four hours. Then the surface oxide film was removed to obtain the SOI wafers in the structure of single-crystal Si semiconductor layer (SOI layer) 150 nm/buried Si oxide layer 400 nm.

Since this SOI layer is part of the single-crystal Si layer with few defects of the FZ wafers produced by the FZ process, there were substantially no defects of COP, FPD, etc. originating in the CZ-Si substrate.

The SOI substrates thus completed were immersed in 49% HF solution for 15 minutes and then observed with an optical microscope. If there were COP inside the SOI layer the Si oxide layer would be etched through the COP part with HF to observe HF Voids from which the Si oxide layer was dissolved out in a circular pattern. In the case of the present example, HF Voids were observed in the density of 0.05 void/cm$^2$.

EXAMPLE 3

The FZ-silicon wafer was prepared as in Example 1.

The ion implantation of $O^+$ was carried out up to $2\times10^{17}$ cm$^{-2}$ by 180 keV through the Si oxide layer of the surface. The temperature during the implantation was 550° C.

After this, the substrate was heat treated at 1350° C. in the $O_2$ (10%)/Ar (90%) atmosphere for four hours. The buried Si oxide layer thus obtained had the thickness of about 100 nm.

This wafer was cleaned and thereafter the ion implantation of $O^+$ was carried out again up to $5\times10^{17}$ cm$^{-2}$ by 180 keV. Then the heat treatment similar to above was carried out. This cycle of cleaning, implantation, and heat treatment was repeatedly carried out before the total implantation amount of oxygen became $2\times10^{18}$ cm$^{-2}$.

Then the surface oxide film was removed to obtain the SOI wafer in the structure of SOI layer 150 nm/buried Si oxide layer 400 nm.

Since this SOI layer was originally part of the FZ wafer layer prepared by the FZ process, there were substantially no defects of COP, FPD, etc. originating in the CZ-Si substrate.

EXAMPLE 4

The FZ-Si wafer was prepared as in Example 1.

Further, an Si oxide film 50 nm thick was formed by thermal oxidation in the surface of the surface single-crystal Si layer (SOI layer).

The ion implantation of $O^+$ was carried out up to $4\times10^{17}$ cm$^{-2}$ by 180 keV through the Si oxide film of the surface. The temperature during the implantation was 550° C.

After this, the substrate was heat treated at 1350° C. in the $O^2$ (10%)/Ar (90%) atmosphere for four hours to change the ion-implanted layer into the buried Si oxide layer. In this way the SOI wafer was obtained in the structure of SOI layer 300 nm/buried Si oxide layer 90 nm.

After this, a further heat treatment was carried out at 1350° C. in an $O^2$ (70%)/Ar (30%) atmosphere for four hours. Then the surface oxide layer on the SOI layer was removed to obtain the SOI wafer in the structure of SOI layer 200 nm/buried Si oxide layer 120 nm.

Since this SOI layer was originally part of the single-crystal Si layer of the FZ wafer, there were substantially no defects of COP, FPD, etc. originating in the CZ-Si substrate.

EXAMPLE 5

The Si wafer produced by the FZ process was prepared.

Further, the surface of this substrate was thermally oxidized to form a silicon oxide film in the thickness of 50 nm.

The ion implantation of $O^+$ was carried out up to $4\times10^{17}$ cm$^{-2}$ by 180 keV through the silicon oxide film in the wafer surface. The temperature during the implantation was 550° C.

After this, this wafer was heat treated at 1350° C. in the $O^2$ (10%)/Ar (90%) atmosphere for four hours. The SOI wafer was obtained in the structure of SOI layer 300 nm/buried oxide layer 90 nm.

After this, a further heat treatment was carried out at 1350° C. in the $O^2$ (70%)/Ar (30%) atmosphere for four hours. Then the oxide film in the surface of wafer was removed to obtain the SOI wafer in the structure of SOI layer 200 nm/buried oxide layer 120 nm.

This SOI layer had no defects of COP, FPD, etc. originating in the CZ-Si substrate.

EXAMPLE 6

Prepared was a p$^+$ type FZ-Si wafer having the specific resistance of 0.01 Ω·cm.

Further, the surface of the FZ wafer was thermally oxidized to form the SiO$_2$ layer 50 nm thick.

The ion implantation of $O^+$ was carried out up to $2\times10^{18}$ $cm^{-2}$ by 180 keV through the Si oxide film of the surface. The temperature during the implantation was 550° C.

After this, the substrate was heat treated at 1350° C. in the $O^2$ (10%)/Ar (90%) atmosphere for four hours. Then the surface Si oxide film was removed to obtain the SOI wafer in the structure of SOI layer 150 nm/buried oxide layer 400 nm.

Since this SOI layer was originally part of the FZ wafer, there were substantially no defects of COP, FPD, etc. originating in the CZ-Si substrate.

After this, the SOI wafer was subjected to a heat treatment in an atmosphere of 100% high-purity hydrogen purified by a hydrogen purifier using a palladium alloy (1100° C., 4h). After this, the surface roughness of the SOI wafer was measured and it was found that the surface roughness was improved from Rrms=0.5 nm before the heat treatment to 0.3 nm. Further, the boron concentration of the SOI wafer, which was $2\times10^{18}/cm^3$ in the SOI layer before the heat treatment, was also reduced to $5\times10^{15}/cm^3$ or less after the heat treatment.

What is claimed is:

1. A method of producing a semiconductor substrate comprising:
   a step of preparing a single-crystal silicon substrate;
   an ion implantation step of implanting ions through one principle surface of the single-crystal silicon substrate into the single-crystal silicon substrate to form an ion-implanted layer; and
   a step of heat treating the single-crystal silicon substrate to form a buried insulating layer inside the single-crystal silicon substrate,
   wherein the single-crystal silicon substrate is one produced by the floating zone process, wherein a protective layer is formed on the single-crystal silicon substrate, prior to the ion implantation step, and then the ions are implanted into the silicon substrate from the side of the protective layer, and wherein the specific resistance in the vicinity of an interface between an area on the side opposite to the one principle surface side of the singlecrystal silicon substrate and the buried insulating layer is not less than 50 Ωcm.

2. The method of producing the semiconductor substrate according to claim 1, wherein the protective layer is a silicon oxide layer formed by thermal oxidation of the single-crystal silicon substrate.

3. The method of producing the semiconductor substrate according to claim 1, wherein the protective layer is a silicon nitride layer.

4. The method of producing the semiconductor substrate according to claim 1, wherein the floating zone process is carried out under an atmosphere of a mixed gas of argon gas and a small amount of nitrogen gas.

5. The method of producing the semiconductor substrate according to claim 1, wherein the ions implanted in the ion implantation step are ions of oxygen or nitrogen.

6. The method of producing the semiconductor substrate according to claim 1, wherein the temperature of the single-crystal silicon substrate in the ion implantation step is in a range of 550° C. to 650° C.

7. The method of producing the semiconductor substrate according to claim 1, wherein the ion implantation step is carried out by the plasma immersion ion implantation.

8. The method of producing the semiconductor substrate according to claim 1, wherein the heat treatment is carried out under an atmosphere of a mixed gas of argon and oxygen.

9. The method of producing the semiconductor substrate according to claim 1, wherein the heat treatment is carried out at a temperature not less than 1000° C. nor more than 1400° C.

10. The method of producing the semiconductor substrate according to claim 1, wherein after the heat treatment, a second heat treatment of the singlecrystal silicon substrate is carried out under an oxidizing atmosphere.

11. The method of producing the semiconductor substrate according to claim 1, comprising a step of cleaning the single-crystal silicon substrate after the ion implantation step and before the heat treatment.

12. The method of producing the semiconductor substrate according to claim 1, wherein a heat treatment of the single-crystal silicon substrate is carried out under a reducing atmosphere containing hydrogen, after formation of the buried insulating layer and after removal of the protective layer on the single-crystal silicon substrate.

13. The method of producing the semiconductor substrate according to claim 12, wherein the heat treatment under the reducing atmosphere containing hydrogen is carried out at a temperature not less than 800° C. nor more than 1350° C.

14. The method of producing the semiconductor substrate according to claim 1, wherein chemical mechanical polishing of a surface of the single-crystal silicon substrate is carried out after formation of the buried insulating layer and after removal of the protective layer on the single-crystal silicon substrate.

15. A method of producing a semiconductor substrate comprising:
   a step of preparing a single-crystal silicon substrate;
   a step of implanting oxygen ions through one principle surface of the single-crystal silicon substrate into the single-crystal silicon substrate to form an ion-implanted layer; and
   a step of forming a buried silicon oxide layer inside the single-crystal silicon substrate,
   wherein the single-crystal silicon substrate is one produced by the floating zone process, wherein the method further comprises a step of carrying out the internal thermal oxidation process of the single-crystal silicon substrate under an oxidizing atmosphere, after formation of the buried silicon oxide layer, and wherein the specific resistance in the vicinity of an interface between an area on the side opposite to the one principle surface side of the single-crystal silicon substrate and the buried insulating layer is not less than 50 Ωcm.

16. The method of producing the semiconductor substrate according to claim 15, wherein the internal thermal oxidation process is carried out at a temperature not less than 1300° C. nor more than the melting point of silicon.

17. A method of producing a semiconductor substrate comprising:
   a step of preparing a single-crystal silicon substrate;
   a step of implanting oxygen ions through one principle surface of the single-crystal silicon substrate into the single-crystal silicon substrate to form an ionimplanted layer; and
   a step of forming a buried silicon oxide layer inside the single-crystal silicon substrate,
   wherein the single-crystal silicon substrate is one produced by the floating zone process, wherein the method further comprises a step of carrying out hydrogen annealing of the single-crystal silicon substrate under a reducing atmosphere containing at least hydrogen, after formation of the buried silicon oxide layer, and wherein the specific resistance in the vicinity of an interface between an area on the side opposite to the one principle surface side of the single-crystal silicon substrate and the buried insulating layer is not less than 50 Ωcm.

18. The method of producing the semiconductor substrate according to claim 15 or 17, further comprising a step of forming a thermally oxidized film on the single-crystal silicon substrate, prior to the step of forming the ion-implanted layer.

19. A semiconductor substrate produced by the method as set forth in claim 18.

20. A semiconductor substrate produced by the method as set forth in either one of claims 1 to 17.

21. A method of producing a semiconductor substrate comprising:

a step of preparing a single-crystal silicon substrate;

an ion implantation step of implanting ions through one principle surface of the single-crystal silicon substrate into the single-crystal silicon substrate to form an ion-implanted layer; and a step of heat treating the single-crystal silicon substrate to form a buried insulating layer inside the single-crystal silicon substrate, wherein the single-crystal silicon substrate is one produced by the floating zone process, and wherein the specific resistance in the vicinity of an interface between an area on the side opposite to the one principle surface side of the single-crystal silicon substrate and the buried insulating layer is not less than 50 Ωcm.

22. A method of producing a semiconducotr substrate comprising:

a step of preparing a single-crystal silicon substrate;

a step of implanting oxygen ions through one principle surface of the single-crystal silicon substrate into the single-crystal silicon substrate to form an ion-implanted layer; and a step of forming a buried silicon oxide layer inside the single-crystal silicon substrate by heat treatment in a non-oxidizing atmosphere, wherein the single-crystal silicon substrate is one produced by the floating zone process, wherein the method further comprises a step of carrying out the internal thermal oxidation process of the single-crystal silicon substrate under an oxidizing atmosphere, after formation of the buried silicon oxide layer, and wherein the specific resistance in the vicinity of an interface between an area on the side opposite to the one principle surface side of the single-crystal silicon substrate and the buried insulating layer is not less than 50 Ωcm.

* * * * *

UNITED STATES PATENT AND TRADEMARK OFFICE
CERTIFICATE OF CORRECTION

PATENT NO. : 6,350,703 B1
DATED : February 26, 2002
INVENTOR(S) : Kiyofumi Sakaguchi et al.

It is certified that error appears in the above-identified patent and that said Letters Patent is hereby corrected as shown below:

Column 2,
Line 22, "23th" should read -- 23rd --.

Column 4,
Line 16, "fewer" should read -- few --.

Column 12,
Line 29, "waqfer" should read -- wafer --; and
Line 31, "implantred" should read -- is implanted --.

Signed and Sealed this

Fourth Day of February, 2003

JAMES E. ROGAN
*Director of the United States Patent and Trademark Office*